(12) United States Patent
Iyoda

(10) Patent No.: US 11,903,128 B2
(45) Date of Patent: Feb. 13, 2024

(54) WIRING SUBSTRATE

(71) Applicant: IBIDEN CO., LTD., Gifu (JP)

(72) Inventor: Shigeto Iyoda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/936,000

(22) Filed: Sep. 28, 2022

(65) Prior Publication Data

US 2023/0115650 A1 Apr. 13, 2023

(30) Foreign Application Priority Data

Oct. 7, 2021 (JP) ................................. 2021-165625

(51) Int. Cl.
*H05K 1/11* (2006.01)

(52) U.S. Cl.
CPC ... *H05K 1/112* (2013.01); *H05K 2201/09481* (2013.01); *H05K 2201/09609* (2013.01)

(58) Field of Classification Search
CPC .......................................... H05K 1/112–1/116
See application file for complete search history.

(56) References Cited

FOREIGN PATENT DOCUMENTS

JP 2004-022713 A 1/2004

*Primary Examiner* — Jeremy C Norris
(74) *Attorney, Agent, or Firm* — Oblon, McClelland, Maier & Neustadt, L.L.P.

(57) ABSTRACT

A wiring substrate includes an insulating layer, a conductor layer formed on a surface of the insulating layer such that the conductor layer includes a conductor pad, and a solder resist layer formed on the surface of the insulating layer such that the solder resist layer is covering the conductor layer and having an opening exposing the conductor pad. The conductor pad of the conductor layer has a substantially rectangular planar shape such that the conductor pads has a main surface, a pair of long sides, a pair of short sides and four corner portions, and the solder resist layer is formed such that the opening is exposing side surfaces at the long sides and 50% or more of the main surface and that the solder resist layer is covering side surfaces at the short sides.

20 Claims, 4 Drawing Sheets

WIRING SUBSTRATE

CROSS-REFERENCE TO RELATED APPLICATIONS

The present application is based upon and claims the benefit of priority to Japanese Patent Application No. 2021-165625, filed Oct. 7, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2004-22713 describes a multilayer wiring substrate having a pad part that is formed on an insulating layer and is bonded to a semiconductor element. The entire contents of this publication are incorporated herein by reference.

SUMMARY OF THE INVENTION

According to one aspect of the present invention, a wiring substrate includes an insulating layer, a conductor layer formed on a surface of the insulating layer such that the conductor layer includes a conductor pad, and a solder resist layer formed on the surface of the insulating layer such that the solder resist layer is covering the conductor layer and having an opening exposing the conductor pad. The conductor pad of the conductor layer has a substantially rectangular planar shape such that the conductor pads has a main surface, a pair of long sides, a pair of short sides and four corner portions, and the solder resist layer is formed such that the opening is exposing side surfaces at the long sides and 50% or more of the main surface and that the solder resist layer is covering side surfaces at the short sides.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
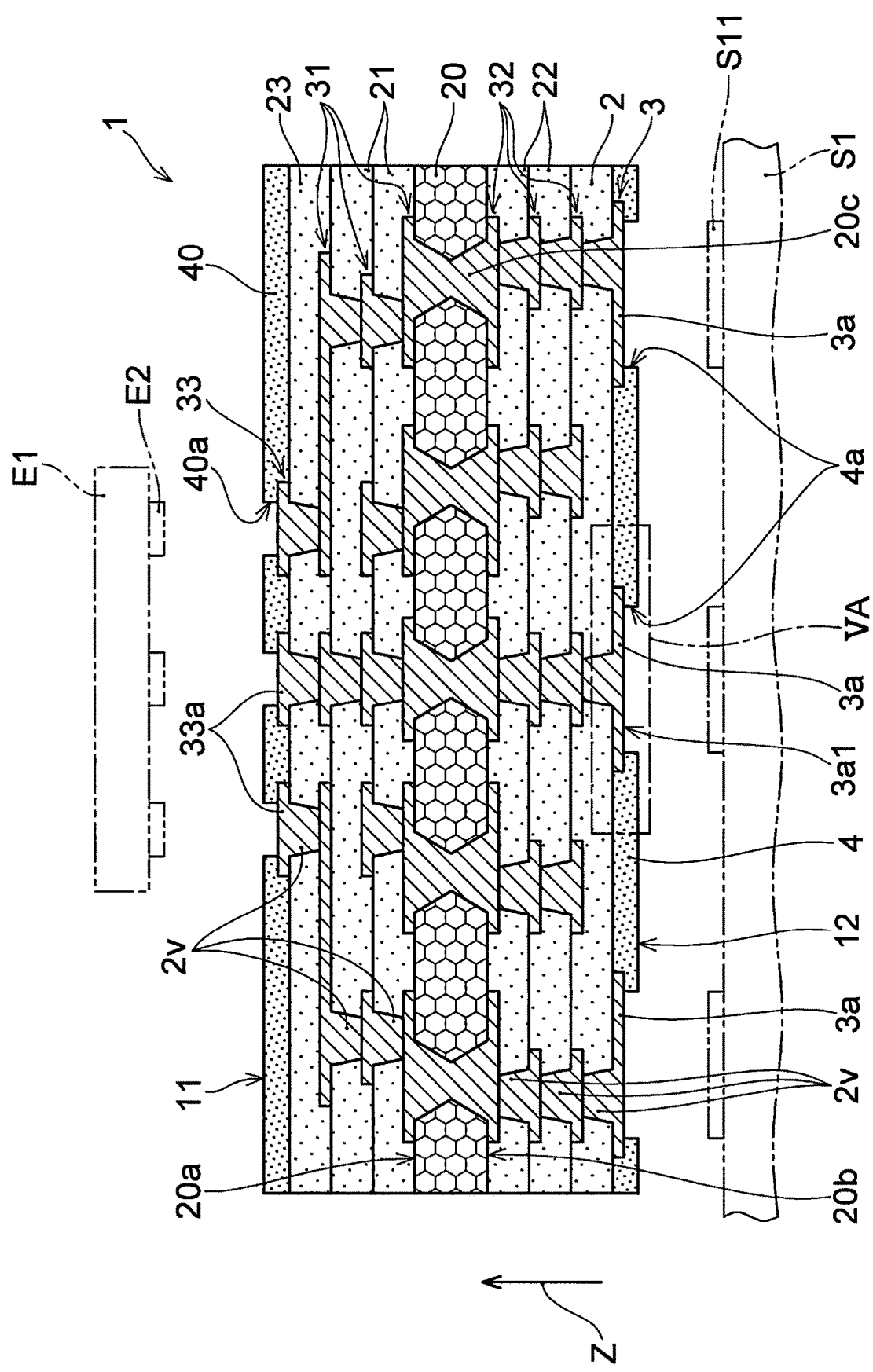
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
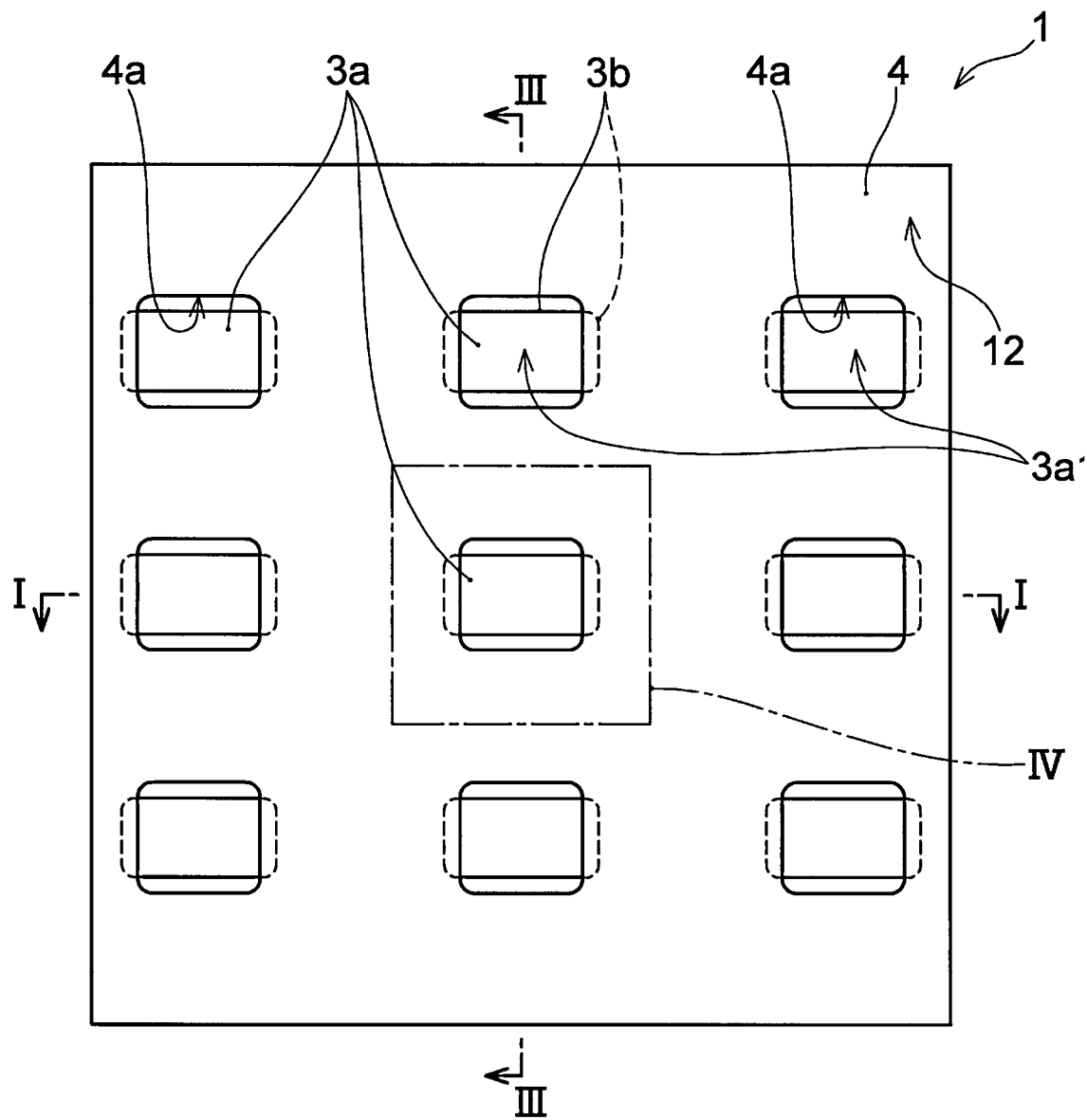
FIG. 2 is a plan view illustrating an example of a wiring substrate according to an embodiment of the present invention.
Figure 3:
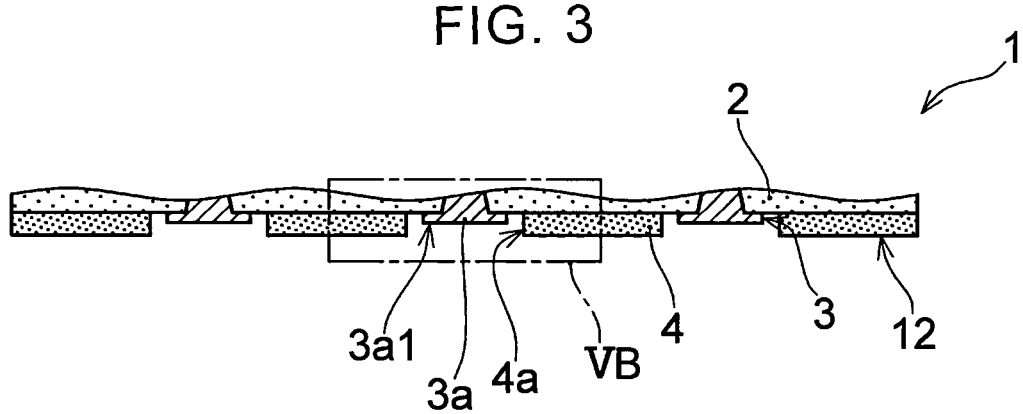
FIG. 3 is a cross-sectional view along a line (III-III) of the wiring substrate of FIG. 2.

A wiring substrate according to an embodiment of the present invention is described with reference to the drawings. FIG. 1 illustrates a cross-sectional view of a wiring substrate 1, which is an example of a wiring substrate according to an embodiment of the present invention. FIG. 2 illustrates a plan view of the wiring substrate 1 from a lower surface side in FIG. 1. A cross-sectional view along an I-I line of FIG. 2 is FIG. 1. Further, a cross-sectional view along an line of FIG. 2 is illustrated in FIG. 3. In FIG. 3, only a region near a lower surface of the wiring substrate 1 in FIG. 1 is illustrated, and the other regions are omitted.

As illustrated in FIG. 1, the wiring substrate 1 includes an insulating layer 20, and conductor layers and insulating layers that are alternately laminated on both sides of the insulating layer 20. On an upper surface (20a) of the insulating layer 20, three conductor layers 31 and two insulating layers 21 are alternately laminated, an insulating layer 23 is further laminated thereon, and a conductor layer 33 is formed on the insulating layer 23. Similarly, on a lower surface (20b) on the opposite side with respect to the upper surface (20a) of the insulating layer 20, three conductor layers 32 and two insulating layers 22 are alternately laminated, an insulating layer (first insulating layer) 2 is further laminated thereon, and a conductor layer (first conductor layer) 3 is formed on the insulating layer 2. A solder resist layer (second solder resist layer) 40 is formed on the insulating layer 23 and the conductor layer 33. A solder resist layer 4 is formed on the insulating layer 2 and the conductor layer 3. In this way, the wiring substrate 1 of the present embodiment includes at least the insulating layer 2, the conductor layer 3 formed on the insulating layer 2, and the solder resist layer 4 formed on the insulating layer 2 and on the conductor layer 3, and, in the example of FIG. 1, further includes the insulating layer 23 and the conductor layer 33.

The wiring substrate 1 has a first surface 11 and a second surface 12 on the opposite side with respect to the first surface 11, as two surfaces extending in a direction orthogonal to a thickness direction of the wiring substrate 1. The thickness direction of the wiring substrate 1 is also simply referred to as a "Z direction." In the wiring substrate 1, the insulating layer 23, the conductor layer 33, and the solder resist layer 40 are formed on the first surface 11 side of the wiring substrate 1, and form a surface layer part on the first surface 11 side of the wiring substrate 1. The first surface 11 is formed of exposed surfaces orthogonal to the Z direction of the insulating layer 23, the conductor layer 33, and the solder resist layer 40. Further, the insulating layer 2, the conductor layer 3, and the solder resist layer 4 are formed on the second surface 12 side of the wiring substrate 1, and form a surface layer part on the second surface 12 side of the wiring substrate 1. The second surface 12 is formed of exposed surfaces orthogonal to the Z direction of the insulating layer 2, the conductor layer 3, and the solder resist layer 4.

Through-hole conductors (20c) connecting the conductor layer 31 and the conductor layer 32 are formed in the insulating layer 20. The insulating layer 20, the conductor layer 31 on the upper surface (20a), and the conductor layer 32 on the lower surface (20b) form a core substrate of the wiring substrate 1. In the insulating layer 2 and the insulating layers (21-23), via conductors (2v) connecting the conductor layers sandwiching the insulating layer 2 and the insulating layers (21-23) are formed.

The insulating layer 2 and the insulating layers (20-23) are each formed using an insulating resin such as an epoxy resin, a bismaleimide triazine resin (BT resin) or a phenol resin. The insulating layers may each contain a reinforcing material (core material) such as a glass fiber, an aramid fiber, or an aramid nonwoven fabric, and/or an inorganic filler such as silica.

The conductor layer 3 and the conductor layers (31-33), the via conductors (2v), and the through-hole conductors (20c) are each formed using any metal such as copper or nickel, and are each formed of, for example, a metal foil such as a copper foil and/or a metal film formed by plating or sputtering or the like. Therefore, the conductor layer 3 and the conductor layers (31-33), the via conductors (2v), and the through-hole conductors (20c) are illustrated in FIG. 1 as each having a single-layer structure, but each may have a multilayer structure that includes two or more metal layers. For example, each of the conductor layer 31 and the conductor layer 32 that are respectively formed on the upper surface (20a) and the lower surface (20b) of the insulating layer 20 may have a three-layer structure that includes a metal foil, an electroless plating film, and an electrolytic plating film. Further, each of the conductor layer 3, the conductor layer 33, the conductor layer 31 and the conductor layer 32 formed on the insulating layer 21 or the insulating layer 22, the via conductors (2v), and the through-hole conductors (20c) may have a two-layer structure that includes, for example, an electroless plating film and an electrolytic plating film.

The conductor layers are patterned to have predetermined conductor pads and/or wiring patterns. In the wiring substrate 1 of the example of FIG. 1, the conductor layer 33 is patterned to have multiple component mounting pads (33a). That is, the wiring substrate 1 includes the multiple component mounting pads (33a) formed on the first surface 11. The multiple component mounting pads (33a) are formed on the insulating layer 23. The component mounting pads (33a) are conductor pads on surfaces of which a component (E1) mounted on the wiring substrate 1 is placed when the wiring substrate 1 is used. That is, the first surface 11 is a component mounting surface of the wiring substrate 1. Electrodes (E2) of the component (E1) are electrically and mechanically connected to the component mounting pads (33a) via a bonding material (not illustrated in the drawings) such as solder.

Examples of the component (E1) include electronic components such as an active component such as a semiconductor integrated circuit device or a transistor, and a passive component such as an electrical resistance. It is also possible that the component (E1) is a wiring material including fine wirings formed on a semiconductor substrate. However, the component (E1) is not limited to these.

In the present embodiment, the conductor layer 3 includes multiple conductor pads (3a). Therefore, the wiring substrate 1 has multiple conductor pads (3a) on the second surface 12. As illustrated in FIG. 2, the conductor pads (3a) each have a substantially rectangular planar shape. A "planar shape" is a shape of an object such as a conductor pad (3a) in a plane view, and "in a plane view" means viewing the object with a line of sight parallel to the Z direction.

In the above and below descriptions, a "rectangular shape" of a substantially rectangular planar shape means a shape surrounded by two sides (line segments) that are parallel to each other and two sides (line segments) that are parallel to each other and orthogonal to the other two sides. In this "rectangular shape," two sides that are adjacent and orthogonal to each other do not necessarily have to connect to each other so as to form a right-angled intersection at the intersection, and a portion (corner) near the intersection may have a shape chamfered by C-chamfering or R-chamfering. In this case, a linear portion of each one side of the substantially rectangular shape preferably has a length of ⅓ or more of a distance between the other two sides orthogonal to that one side. In each of the conductor pads (3a) in the example of FIG. 2, all four corner portions are R-chamfered.

In the wiring substrate 1 in the example of FIG. 1, similarly to the first surface 11, the second surface 12 may be a component mounting surface on which an electronic component such as a semiconductor integrated circuit device is mounted. Further, when the wiring substrate 1 itself is mounted on an external wiring substrate, for example, an external element (S1) such as a motherboard of any electrical device, the second surface 12 may be a connecting surface connected to the external element (S1). That is, for example, the wiring substrate 1 may form a part of a package of the component (E1) such as a semiconductor integrated circuit mounted on the first surface 11. In this case, as illustrated in FIG. 1, the wiring substrate 1 may be mounted on the external element (S1) together with the component (E1) with the second surface 12 facing the external element (S1).

When the second surface 12 is the connecting surface to the external element (S1), the second surface 12 may have connecting portions to the external element (S1). The wiring substrate 1 in the example of FIG. 1 is connected to the external element (S1) at the conductor pads (3a). Therefore, the conductor pads (3a) in the example of FIG. 1 are connection pads connected to the external element (S1) in the wiring substrate 1, and the connection pads to the external element (S1) in the wiring substrate 1 in FIG. 1 are formed of the conductor pads (3a).

In the example of FIG. 1, the conductor pads (3a) are not directly connected to conductor pads and/or wiring patterns other than the conductor pads (3a) included in the conductor layer 3. That is, the conductor pads (3a) in the example of FIG. 1 are so-called independent pads. Further, in the example of FIG. 1, the conductor pads (3a) are connected to the via conductors (2v) that connect the conductor layers (conductor layer 3 and conductor layer (second conductor layer) 32) sandwiching the insulating layer 2. Therefore, the conductor pads (3a) in the example of FIG. 1 are so-called via pads.

The conductor pads (3a) are electrically and mechanically connected to electrodes (S11) of the external element (S1) by a bonding member such as solder. As described above, the external element (S1) may be a motherboard of any electrical device, or may be any electronic component having a package size larger than that of the wiring substrate 1. Without being limited to these, the conductor pads (3a) may be connected to any substrate, electrical component, mechanical component, or the like.

In the example of FIG. 1, each of the conductor pads (3a) is larger than each of the multiple component mounting pads (33a) of the conductor layer 33 provided on the first surface 11 side. It is thought that the external element (S1), which is larger than the component (E1), and the wiring substrate 1 are firmly connected to each other with a large area.

The solder resist layers (4, 40) are each formed using, for example, an epoxy resin, a polyimide resin, or the like. The solder resist layer 40 has openings (40a) exposing the component mounting pads (33a). In the example of FIG. 1, the solder resist layer 40 covers peripheral edges of the component mounting pads (33a), and portions other than the peripheral edges of the component mounting pads (33a) are exposed in the openings (40a).

On the other hand, as illustrated in FIGS. 1-3, the solder resist layer 4 has openings (4a) exposing the conductor pads (3a). The openings (4a) expose 50% or more of an area of a main surface (3a1), which is a surface on the opposite side with respect to the insulating layer 2, of each of the conductor pads (3a). The openings (4a) may expose a majority of the main surface (3a1) of each of the conductor pads (3a). The conductor pads (3a) are exposed in the openings (4a) except for portions of peripheral edges of the conductor pads (3a). Therefore, the wiring substrate 1 and the external element (S1) are firmly connected to each other with a large area.

In the present embodiment, peripheral edges (3b) of the conductor pads (3a) are partially exposed in the openings (4a) without being covered by the solder resist layer 4, as illustrated in FIGS. 1-3, and the peripheral edges (3b) of the conductor pads (3a) are partially covered by the solder resist layer 4 as illustrated in FIGS. 1-3.

Figure 4:
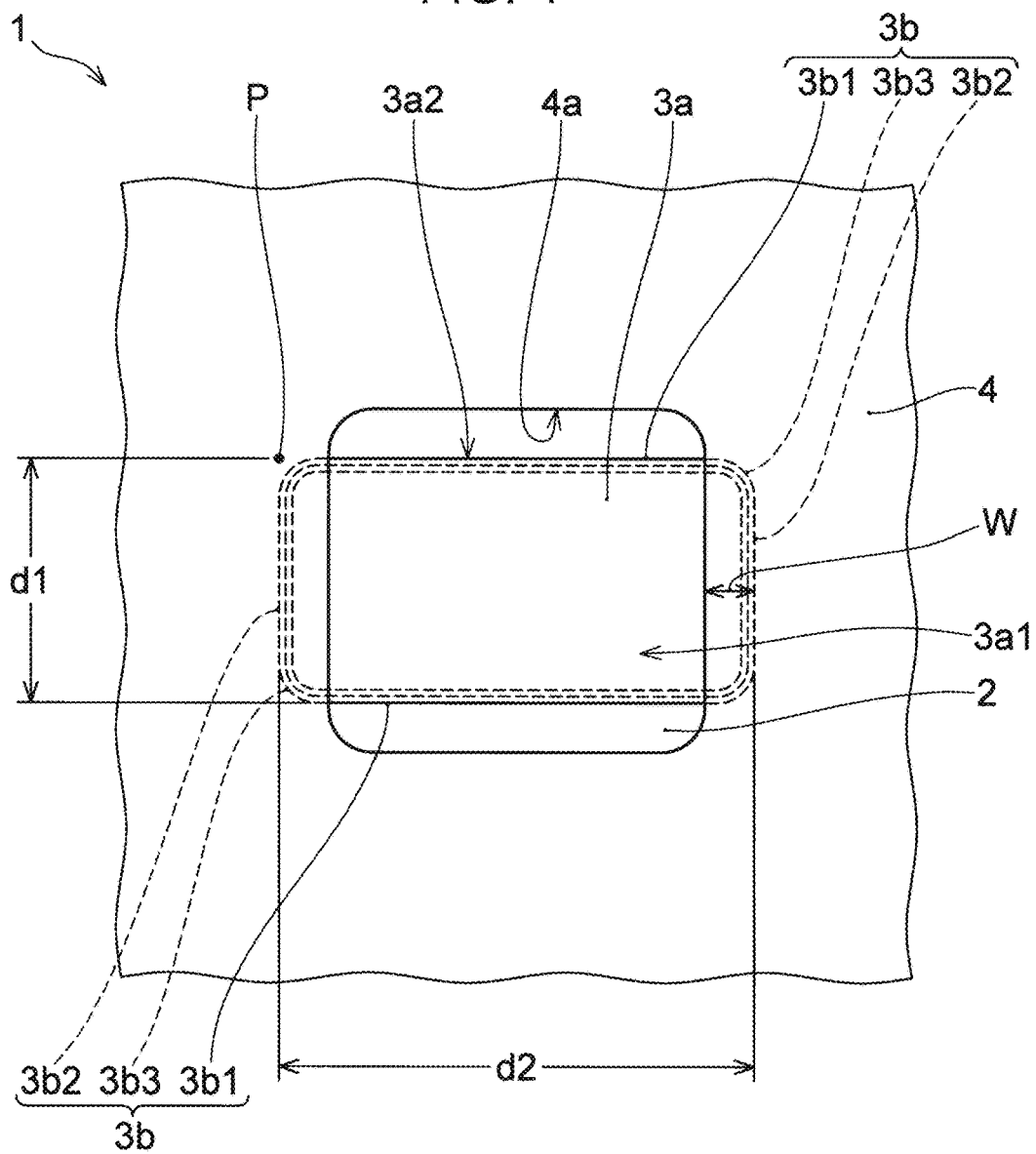
FIG. 4 is an enlarged view of a portion (IV) of FIG. 2.
Figure 5A:
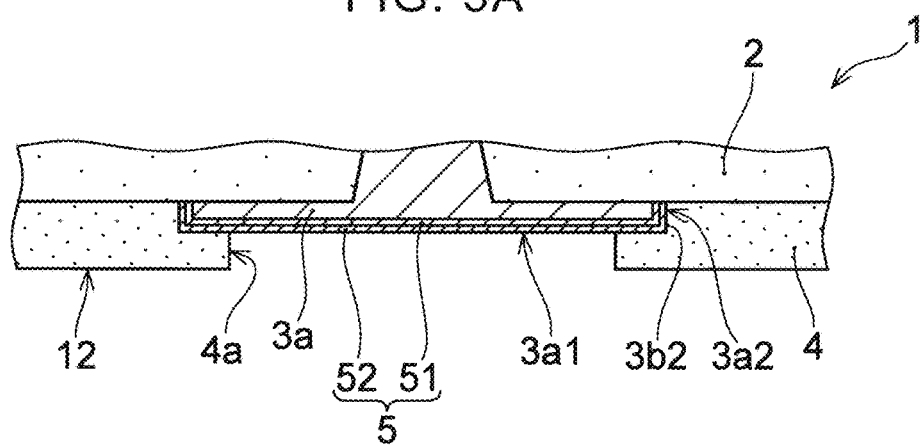
FIG. 5A is an enlarged view of a portion (VA) of FIG. 1.
Figure 5B:
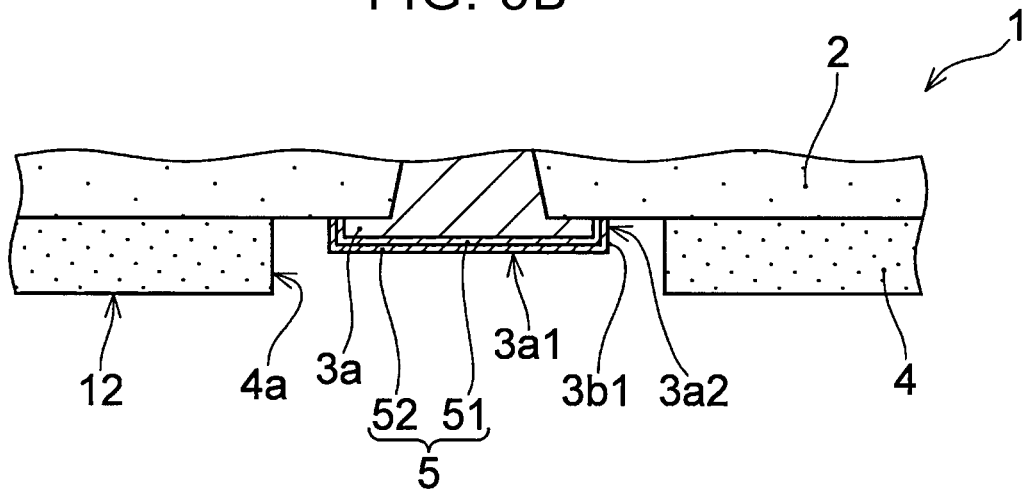
FIG. 5B is an enlarged view of a portion (VB) of FIG. 3.

With reference to FIGS. 4, 5A and 5B, the conductor pads (3a) and the openings (4a) of the solder resist layer 4 are further described. FIG. 4 illustrates an enlarged view of a portion (IV) of FIG. 2, FIG. 5A illustrates an enlarged view of a portion (VA) of FIG. 1, and FIG. 5B illustrates an enlarged view of a portion (VB) of FIG. 3. In FIGS. 5A and 5B, similar to FIG. 3, only a region near the second surface 12 of the wiring substrate 1 is illustrated, and the other regions are omitted.

As described above, the conductor pads (3a) each have a substantially rectangular planar shape including two pairs of two opposing sides. For example, the peripheral edge (3b) of each of the substantially rectangular conductor pads (3a) is formed of two long sides (long side portions) (3b1) and two short sides (short side portions) (3b2) of the two pairs, and corner portions (3b3).

Here, in the present embodiment, the "corner portions" of the peripheral edge are each a portion within a specific length on each side from an intersection point of two adjacent sides (one long side portion (3b1) and one short side portion (3b2)) (when the portion near the intersection point is chamfered, the intersection point is an intersection point of extension lines of the two sides, for example, a point (P) in FIG. 4). Further, the "side portions" are portions other than the "corner portions" of the peripheral edge of each of the rectangular conductor pads. The "specific length" on each side is, for example, a length within ¼ of a distance between two sides orthogonal to the each side, and is preferably a length of 1/10 or more of the distance. A portion within the "specific length" of a short side may be a "corner portion" of the two sides. For example, in FIG. 4, the corner portion (3b3) of the two sides (a long side portion (3b1) and a short side portion (3b2)) sandwiching the point (P) is a portion within a length of ¼ of a distance (d1) between the two long side portions (3b1) from the point (P) on each of the two sides (a long side portion (3b1) and a short side portion (3b2)). When the conductor pads (3a) of the wiring substrate 1 of the present embodiment are chamfered at intersection points of the substantially rectangular shapes such as in the case of the conductor pad (3a) in the example of FIG. 4, each of the "corner portions" may be a chamfered portion, or may be the smaller of the portion within the "specific length" described above and the chamfered portion.

As illustrated in FIGS. 4 and 5A, the side surface (3a2) and the main surface (3a1) of each of the conductor pads (3a) are covered by the solder resist layer 4 at the short side portions (3b2) of the peripheral edge (3b) of the each of the conductor pads (3a) in a plan view. Further, the side surface (3a2) and the main surface (3a1) of each of the conductor pads (3a) are covered by the solder resist layer 4 at corner portions (3b3) of the peripheral edge (3b) of the each of the conductor pads (3a) in a plan view. On the other hand, as illustrated in FIGS. 4 and 5B, the side surface (3a2) and the main surface (3a1) of each of the conductor pads (3a) are exposed in the opening (4a) at the long side portions (3b1) of the peripheral edge (3b) of the each of the conductor pads (3a) in a plan view.

As described above, a stress may be generated in the conductor pads (3a) and the insulating layer 2 due to a difference in thermal expansion coefficient between the two or due to an external force. In this case, the stress is likely to concentrate near the peripheral edges (3b) of the conductor pads (3a), which are boundaries between a region where the conductor pads (3a) are present and a region where the conductor pads (3a) are not present on the surface of the insulating layer 2. Then, the insulating layer 2 may be unable to withstand the concentrated stress, and a crack may occur in a portion overlapping the peripheral edges (3b) of the conductor pads (3a), or interface peeling may occur between the insulating layer 2 and the conductor pads (3a) starting from the peripheral edges (3b) of the conductor pads (3a). Such stress concentration may be more significant in curved portions than in linear portions of the peripheral edges (3b) of the conductor pads (3a). Therefore, it is thought that a crack or the like is more likely to occur at the corner portions (3b3) than at the long side portions (3b1) or the short side portions (3b2) of the peripheral edges (3b) of the conductor pads (3a).

On the other hand, in the present embodiment, since the conductor pads (3a) are covered by the solder resist layer 4 at the corner portions (3b3) of the peripheral edges (3b) of the conductor pads (3a), it is thought that force acting on the insulating layer 2 is relaxed. For example, a stress caused by the presence of the conductor pads (3a) may be dispersed also on the solder resist layer 4 side, or a relative behavior of the conductor pads (3a) with respect to the insulating layer 2 may be restricted by the solder resist layer 4. As a result, in the present embodiment, it is thought that a defect such as a crack or interfacial peeling around the corner portions (3b3) of the conductor pads (3a) is suppressed. Preferably, as illustrated in FIG. 4, each of the conductor pads (3a) is covered by the solder resist layer 4 at all the four corner portions (3b3).

In the present embodiment, the peripheral edge (3b) of each of the conductor pads (3a) is covered by the solder resist layer 4 also at the short side portions (3b2) in addition to the corner portions (3b3). Therefore, it is thought that a defect near the peripheral edges (3b) of the conductor pads (3a) is further suppressed. A crack in the insulating layer 2 or interfacial peeling between the insulating layer 2 and the conductor pads (3a) is unlikely to occur.

Further, in this way, by covering also two opposing sides in addition to the corner portions (3b3) by the solder resist layer 4, shapes of the openings (4a) are simplified, and the openings (4a) are formed easily and stably as designed. Then, in this way, when two opposing sides are covered by the solder resist layer 4, as illustrated in the present embodiment, covering the short side portions (3b2) rather than covering the long side portions (3b1) may be advantageous as described below.

For example, in a wiring substrate according to an embodiment of the present invention, a distance (d2) between the two short side portions (3b2) of each of the conductor pads (3a) in a plan view is about 1.3 or more and about 2.0 or less times the distance (d1) between the two long side portions (3b1), and preferably about 1.5 or more and about 1.6 or less times the distance (d1). In the present embodiment, the long side portions (3b1) of the peripheral edge (3b) of each of the conductor pads (3a) are exposed from the solder resist layer 4. It is thought that, as compared to a case where the long side portions (3b1) are covered and the short side portions (3b2) are exposed, by covering the short side portions (3b2) and exposing the long side portions (3b1), a larger area that is used as a conductor on the main surface (3a1) of each of the conductor pads (3a) is ensured. While a crack in the insulating layer 2 or interfacial peeling between the insulating layer 2 and the conductor pads (3a) is suppressed by the solder resist layer 4 covering the corner portions (3b3) and the short side portions (3b2) of the peripheral edge (3b) of each of the conductor pads (3a), a connection region having a reliable and sufficient area for connecting to the external element (S1) is provided in the conductor pads (3a).

In other words, by covering the short side portions (3b2) rather than the long side portions (3b1), it may be possible that an area required for the entire conductor pads (3a) in order to ensure a desired connection region is reduced. That is, when a side portion of a conductor pad (3a) is covered by the solder resist layer 4 and a distance from an opening (4a) of the solder resist layer 4 to this side portion is a covering width (W) (see FIG. 4), an area to be expanded as a covered portion in addition to an area of a desired connection region in a case where a long side portion (3b1) is covered (length of the long side portion (3b1) x the covering width (W)) is clearly larger than an area to be expanded in a case where a short side portion (3b2) is covered (length of the short side portion (3b2) x the covering width (W)). Therefore, an entire area of the conductor pads (3a) is increased, which may hinder formation of the conductor pads (3a) at a fine pitch. Further, the increase in the area of the conductor pads (3a) may cause a reflection loss in high-speed signal transmission as a sudden change in characteristic impedance. However, in the present embodiment, since the short side portions (3b2) are covered, a fine pitch or signal transmission quality is unlikely to be affected.

Here, the "connection region" is a region of the entire surfaces of the conductor pads (3a) that contributes to connecting to an external element connected to the conductor pads (3a), and is a region of the main surfaces (3a1) and side surfaces (3a2) of the conductor pads (3a) that is not covered by the solder resist layer 4. When an area of the connection region is small, it may be possible that sufficient connection strength cannot be obtained.

Also, in the substantially rectangular conductor pads (3a) that each include two short side portions (3b2) and two long side portions (3b1) defined by the distances (d1, d2) as described above, by covering the short side portions (3b2) by the solder resist layer 4, the planar shape of the main surface (3a1) of each of the conductor pads (3a) exposed by the openings (4a) is formed close to being a substantially square. It is thought that connection to the electrodes (S11) of the external element (S1) illustrated in FIG. 1 or the like becomes easier. Preferably, the planar shape of the main surface (3a1) of each of the conductor pads (3a) exposed by the openings (4a) of the solder resist layer 4 is a substantially square.

In the present embodiment, the side surfaces (3a2) and the main surfaces (3a1) of the conductor pads (3a) are exposed in the openings (4a) at the long side portions (3b1) of the peripheral edges (3b) of the conductor pads (3a). The conductor pads (3a) are bonded with a bonding material (not illustrated in the drawings) used for connection to an external element not only on the main surfaces (3a1) but also on the side surfaces (3a2). A ratio of the connection region to the area of the conductor pads (3a) is increased. It is thought that necessary and sufficient connection strength is easily obtained. Further, it may be possible that a connection area is increased and a resistance to a force acting in a direction parallel to the main surfaces (3a1) of the conductor pads (3a) is also improved. It is thought that the conductor pads (3a) and the external element (S1) or the like illustrated in FIG. 1 are firmly connected.

In the wiring substrate 1 of the present embodiment, as described above, each of the conductor pads (3a) is larger than each of the multiple component mounting pads (33a) provided on the first surface 11 side. Therefore, each of the conductor pads (3a) has a large planar area, and thus has a relatively large interface with respect to the insulating layer 2. Therefore, a stress concentrated on the peripheral edges (3b) is likely to become excessive. It is thought that the present embodiment is particularly beneficial for conductor pads each having a relatively large planar area such as the conductor pads (3a).

In the conductor pads having a large planar area, when the entire peripheral edges are covered by the solder resist layer and a sufficient connection region is ensured, a high-density formation of the conductor pads or miniaturization of the wiring substrate 1 is likely to be difficult. In the present embodiment, the conductor pads (3a) are covered by the solder resist layer 4 at the short side portions (3b2) and at the corner portions (3b3) where a defect such as a crack is likely to occur, and are exposed in the openings (4a) at the long side portions (3b1). Therefore, it is thought that a sufficient connection region is ensured without hindering a high-density formation of the conductor pads (3a) while effectively suppressing a defect such as a crack. Improvement or the like of the insulating layer such as suppressing occurrence of a defect such as a crack is also not necessary. A high-quality wiring board with few restrictions on wiring design is provided.

In the present embodiment, at least 50% or more of each corner portion (3b3) of the peripheral edge (3b) of each of the conductor pads (3a) is covered by the solder resist layer 4 on each of the two sides that are adjacent to each other via the each corner portion (3b3). Further, at least 50% or more of each long side portion (3b1) of the peripheral edge (3b) of each of the conductor pads (3a) is exposed in an opening (4a) of the solder resist layer 4. It is thought that a sufficient connection region is ensured and a defect near the peripheral edges (3b) of the conductor pads (3a) is likely to be suppressed. In the present embodiment, each of the corner portions (3b3) does not have to be entirely covered by the solder resist layer 4, and each of the long side portions (3b1) does not have to be entirely exposed.

As illustrated in FIG. 4, the openings (4a) of the solder resist layer 4 each have a substantially rectangular planar shape. The sides of each of the openings (4a) are respectively formed substantially parallel to the sides of the peripheral edge (3b) of each of the conductor pads (3a). However, in the present embodiment, the shape of each of the openings (4a) of the solder resist layer 4 is not limited to the shape illustrated in FIG. 4. The openings (4a) may be formed such that 50% or more of each of the long side portions (3b1) of the peripheral edge (3b) of each of the conductor pads (3a) is exposed.

Preferably, one opening (4a) of the solder resist layer 4 exposes the main surface (3a1) of one conductor pad (3a). Further, preferably, an area of each of the openings (4a) in a plan view is about 120% or more and about 150% or less of an area of the main surface (3a1) of each of the conductor pads (3a) in a plan view. In contact with a sufficient connection region is ensured in the conductor pads (3a).

Although omitted in FIGS. 1-3 referenced earlier, as illustrated in FIGS. 4, 5A, and the wiring substrate 1 includes a surface treatment layer 5 that covers the main surfaces (3a1) and the side surfaces (3a2) of the conductor pads (3a). The surface treatment layer 5 is a film formed by an anticorrosion treatment and/or a rust prevention treatment of exposed portions of the main surfaces (3a1) and the side surfaces (3a2) of the conductor pads (3a). The surface treatment layer 5 prevents corrosion, oxidation, or the like of the conductor pads (3a).

The surface treatment layer 5 is, for example, a metal film containing a metal different from the conductor pads (3a) or an organic film containing an organic substance such as an imidazole compound. When the conductor pads (3a) are formed of copper, the surface treatment layer 5 may be formed of nickel, palladium, silver, gold, or an alloy of these, or solder, or the like. In the example of FIGS. 4, 5A, and 5B, the surface treatment layer 5 has a two-layer structure including a lower layer 51 formed on a main body side of the conductor pads (3a) and an upper layer 52 formed on the lower layer 51. The lower layer 51 is, for example, a nickel film or an alloy film of nickel and palladium, and the upper layer is, for example, a metal film formed of gold.

When the surface treatment layer 5 is formed of a material having a thermal expansion coefficient between a thermal expansion coefficient of a material forming main bodies of the conductor pads (3a) and a thermal expansion coefficient of the insulating layer 2, it is thought that a stress generated in the insulating layer 2 and the conductor pads (3a) is reduced as compared to a case where the surface treatment layer 5 is not formed. Further, even when the surface treatment layer 5 is formed of a material having a larger difference in thermal expansion coefficient from the insulating layer 2 than from the conductor pads (3a), in the present embodiment, since the short side portions (3b2) and the corner portions (3b3) of the conductor pads (3a) are covered by the solder resist layer 4, it is thought that a defect such as a crack is unlikely to occur.

Figure 6:
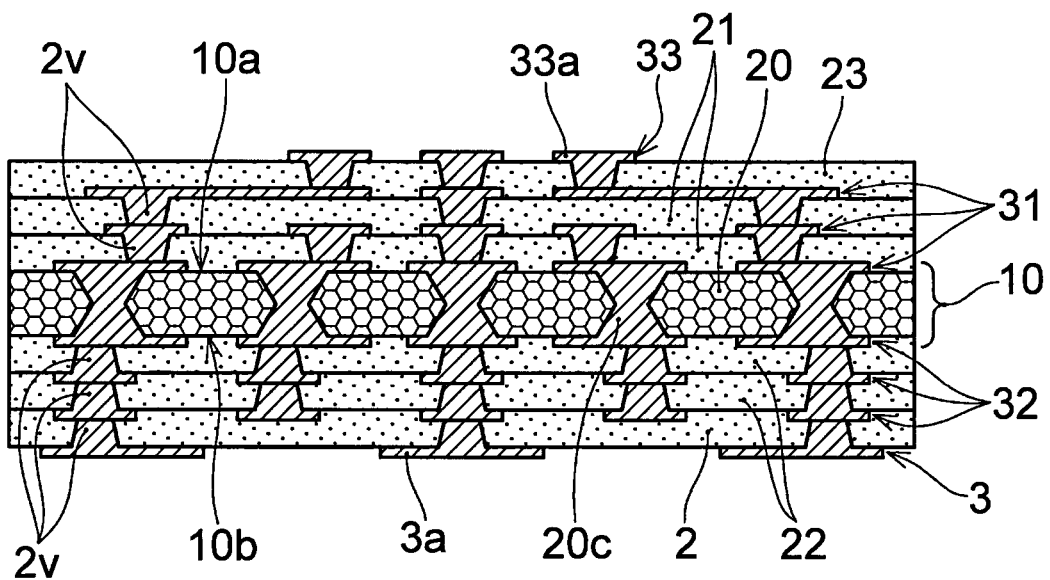
FIG. 6 is a cross-sectional view illustrating an example of a state of a wiring substrate according to an embodiment of the present invention during a manufacturing process.

A wiring substrate according to an embodiment of the present invention may be manufactured using a common method for manufacturing a wiring substrate. With reference to FIG. 6, an example of a manufacturing method is outlined using a case where the wiring substrate 1 illustrated in FIG. 1 is manufactured as an example. As illustrated in FIG. 6, a core substrate 10 is prepared, an insulating layer 21 is laminated on one surface (10a) side of the core substrate 10, and a conductor layer 31 is formed on the insulating layer 21. Similarly, an insulating layer 22 is laminated on the other surface (10b) side of the core substrate 10, and a conductor layer 32 is formed on the insulating layer 22. Then, on the both sides of the core substrate 10, lamination of an insulating layer and formation of a conductor layer are repeated, and the outermost insulating layer 23 and the outermost insulating layer 2 are respectively formed on the one surface (10a) side and the other surface (10b) side of the core substrate 10.

In the preparation of the core substrate 10, for example, a double-sided copper-clad laminate containing the insulating layer 20 is prepared. Then, the core substrate 10 is prepared using a subtractive method or the like to form the conductor layers (31, 32) including predetermined conductor patterns on the both sides of the insulating layer 20 and form the through-hole conductors (20c) in the insulating layer 20. The insulating layers (21, 22), and the conductor layers (31, 32) on the insulating layer 21 or the insulating layer 22 are each formed, for example, using a common method for manufacturing a build-up substrate. For example, the insulating layers are each formed by thermocompression bonding an epoxy resin on a film onto the core substrate 10 or onto an insulating layer and a conductor layer formed earlier. Further, the conductor layers are each formed using any method for forming a conductor pattern such as a semi-additive method or a full additive method, including plating resist formation and pattern plating, and the like. In the formation of the conductor layers using a method for forming a conductor pattern, such as a semi-additive method, the via conductors (2v) are formed in the insulating layers.

As illustrated in FIG. 6, the conductor layer 33 is further formed on the insulating layer 23, and the conductor layer 3 is further formed on the insulating layer 2. The conductor layer 3 is formed using any method for forming a conductor pattern, such as a semi-additive method using a plating resist (not illustrated in the drawings) having appropriate opening patterns so as to include the conductor pads (3a). Similarly, the conductor layer 33 is formed using any method for forming a conductor pattern so as to include the component mounting pads (33a).

Then, as illustrated in FIG. 1, the solder resist layer 40 is formed on the insulating layer 23 and the conductor layer 33, and the solder resist layer 4 is formed on the insulating layer 2 and the conductor layer 3. The openings (4a) and the openings (40a) are respectively provided in the solder resist layers (4, 40). The solder resist layers (4, 40) are each formed by applying, spraying, or laminating in a form of a film, a photosensitive epoxy resin or polyimide resin. Then, the openings (4a, 40a) are formed, for example, by exposure and development, or laser processing, or the like. The surface treatment layer 5 (see FIGS. 5A and 5B) is formed on the surfaces of the conductor pads (3a) exposed in the openings (4a), and on the surfaces of the component mounting pads (33a) exposed in the openings (40a). The surface treatment layer 5 is formed on the surfaces of the conductor pads (3a) and on the surfaces of the component mounting pads (33a) by depositing a metal such as nickel, palladium, or gold by electroless plating, electrolytic plating, or the like, or by applying a heat resistant organic material by spraying. Through the above processes, the wiring substrate 1 in the example of FIG. 1 is completed.

A wiring substrate according to an embodiment of the present invention is not limited to those having the structures illustrated in the drawings and those having the structures, shapes, and materials exemplified herein. A wiring substrate according to an embodiment of the present invention may have any laminated structure. For example, a wiring substrate according to an embodiment of the present invention may be a coreless substrate that does not include a core substrate. A wiring substrate according to an embodiment of the present invention may include any number of conductor layers and any number of insulating layers. A wiring substrate according to an embodiment of the present invention may be a so-called double-sided substrate or single-sided substrate. It is also possible that the surface treatment layer 5 is not provided on the conductor pads (3a). As described above, the conductor pads of which the corner portions of the peripheral edges are covered by the solder resist layer and of which the side portions of the peripheral edges are exposed in the openings of the solder resist layer may be provided on both surfaces of the wiring substrate or may be provided on only one of the two surfaces of the wiring substrate.

Japanese Patent Application Laid-Open Publication No. 2004-22713 describes a multilayer wiring substrate having a pad part that is formed on an insulating layer and is bonded to a semiconductor element. A solder resist is provided on the insulating layer, and the pad part is formed in an opening of the solder resist in a state of being separated from the solder resist.

In a conductor pad formed on an insulating layer, such as a pad part described in Japanese Patent Application Laid-Open Publication No. 2004-22713, and the insulating layer as a lower layer of the connection pad, a stress may occur due to a difference in thermal expansion coefficient between the conductor pad and the insulating layer, or due to an external force applied from an external component connected to the conductor pad. Therefore, it is thought that a defect such as a crack or interfacial peeling between the insulating layer and the conductor pad due to the stress is likely to occur in the conductor pad and the insulating layer in a vicinity of the conductor pad.

A wiring substrate according to an embodiment of the present invention has a first surface and a second surface on the opposite side with respect to the first surface, and includes: a first insulating layer; a first conductor layer formed on the first insulating layer; and a solder resist layer formed on the first insulating layer and on the first conductor layer. The first conductor layer includes a conductor pad having a substantially rectangular planar shape. The solder resist layer has an opening that exposes 50% or more of an area of a main surface of the conductor pad, the main surface being a surface on the opposite side with respect to the first insulating layer. A side surface and the main surface of the conductor pad are exposed in the opening at a pair of long sides among two pairs of opposing two sides of a peripheral edge of the conductor pad. The side surface and the main surface of the conductor pad are covered by the solder resist layer at a pair of short sides among the two pairs of opposing two sides and at corner portions of the peripheral edge.

According to an embodiment of the present invention, a high quality wiring substrate is provided in which it is thought that, while an exposed portion having a required size is ensured in the conductor pad provided in the wiring substrate, a defect such as a crack in the insulating layer around the conductor pad is unlikely to occur.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   an insulating layer;
   a conductor layer formed on a surface of the insulating layer such that the conductor layer includes a conductor pad; and
   a solder resist layer formed on the surface of the insulating layer such that the solder resist layer is covering the conductor layer and having an opening exposing the conductor pad,
   wherein the conductor pad of the conductor layer has a substantially rectangular planar shape such that the conductor pads has a main surface, a pair of long sides, a pair of short sides and four corner portions, and the solder resist layer is formed such that the opening is exposing side surfaces at the long sides and 50% or more of the main surface and that the solder resist layer is covering side surfaces at the short sides.

2. The wiring substrate according to claim 1, wherein the conductor layer is formed such that the conductor pad is an independent pad that is not directly connected to another pad or a wiring formed in the conductor layer.

3. The wiring substrate according to claim 2, further comprising:
   a second conductor layer formed on a second surface of the insulating layer on an opposite side with respect to the conductor layer; and
   a via conductor formed in the insulating layer such that the via conductor is connecting the second conductor layer and the conductor pad of the conductor layer such that the conductor pad forms a via pad.

4. The wiring substrate according to claim 2, wherein the conductor layer is formed such that a distance between the pair of short sides of the conductor pad is in a range of 1.3 to 2.0 times a distance between the pair of long sides of the conductor pad.

5. The wiring substrate according to claim 2, wherein the solder resist layer is formed such that the opening has a substantially rectangular planar shape.

6. The wiring substrate according to claim 2, wherein the solder resist layer is formed such that the solder resist layer is covering the four corner portions of the conductor pad.

7. The wiring substrate according to claim 2, further comprising:
   a surface treatment layer covering the conductor pad.

8. The wiring substrate according to claim 2, wherein the conductor layer is formed on a surface side of the wiring substrate on an opposite side with respect to a component mounting surface configured to mount a component.

9. The wiring substrate according to claim 8, further comprising:
   a plurality of component mounting pads forming the component mounting surface such that the conductor pad of the conductor layer is larger than each of the component mounting pads.

10. The wiring substrate according to claim 2, wherein the conductor layer is formed such that the conductor pad is a connection pad configured to connect an external element.

11. The wiring substrate according to claim 1, further comprising:
    a second conductor layer formed on a second surface of the insulating layer on an opposite side with respect to the conductor layer; and
    a via conductor formed in the insulating layer such that the via conductor is connecting the second conductor layer and the conductor pad of the conductor layer such that the conductor pad forms a via pad.

12. The wiring substrate according to claim 1, wherein the conductor layer is formed such that a distance between the pair of short sides of the conductor pad is in a range of 1.3 to 2.0 times a distance between the pair of long sides of the conductor pad.

13. The wiring substrate according to claim 1, wherein the solder resist layer is formed such that the opening has a substantially rectangular planar shape.

14. The wiring substrate according to claim 1, wherein the solder resist layer is formed such that the solder resist layer is covering the four corner portions of the conductor pad.

15. The wiring substrate according to claim 1, further comprising:
    a surface treatment layer covering the conductor pad.

16. The wiring substrate according to claim 1, wherein the conductor layer is formed on a surface side of the wiring substrate on an opposite side with respect to a component mounting surface configured to mount a component.

17. The wiring substrate according to claim 1, wherein the conductor layer is formed such that the conductor pad is a connection pad configured to connect an external element.

18. The wiring substrate according to claim 16, further comprising:
- a plurality of component mounting pads forming the component mounting surface such that the conductor pad of the conductor layer is larger than each of the component mounting pads.

19. The wiring substrate according to claim 18, further comprising:
- a second solder resist layer covering peripheral edges of the component mounting pads and having a plurality of openings exposing portions of the component mounting pads other than the peripheral edges of the component mounting pads.

20. The wiring substrate according to claim 1, wherein the conductor layer is formed such that each of the corner portions of the conductor pad is R-chamfered.

* * * * *